(12) United States Patent
Birkner et al.

(10) Patent No.: US 7,028,565 B2
(45) Date of Patent: *Apr. 18, 2006

(54) METHOD AND ARRANGEMENT FOR TRANSPORTING AND INSPECTING SEMICONDUCTOR SUBSTRATES

(75) Inventors: Andreas Birkner, Jena (DE); Frank Bernhardt, Kahla (DE); Knut Hiltawski, Saalfeld (DE)

(73) Assignee: Leica Microsystems Jena GmbH, Jena (DE)

(*) Notice: Subject to any disclaimer, the term of this patent is extended or adjusted under 35 U.S.C. 154(b) by 143 days.

This patent is subject to a terminal disclaimer.

(21) Appl. No.: 10/768,688

(22) Filed: Feb. 2, 2004

(65) Prior Publication Data

US 2004/0149055 A1 Aug. 5, 2004

Related U.S. Application Data

(60) Continuation of application No. 10/379,677, filed on Mar. 6, 2003, now Pat. No. 6,789,436, which is a division of application No. 10/053,628, filed on Jan. 24, 2002, now Pat. No. 6,553,850.

(30) Foreign Application Priority Data

Jan. 25, 2001 (DE) ................................ 101 03 253

(51) Int. Cl.
B65G 49/07 (2006.01)

(52) U.S. Cl. .................................................. 73/865.8

(58) Field of Classification Search .................. 73/863, 73/865.8; 414/222, 223, 935, 940, 744.3; 356/237.4, 237.5, 244

See application file for complete search history.

(56) References Cited

U.S. PATENT DOCUMENTS

| | | |
|---|---|---|
| 5,162,047 A | 11/1992 | Wada et al. |
| 5,746,565 A | 5/1998 | Tepolt |
| 5,807,062 A | 9/1998 | Schultz et al. |
| 5,851,102 A | 12/1998 | Okawa et al. |
| 5,863,170 A | 1/1999 | Boitnott et al. |
| 5,917,601 A | 6/1999 | Shimazaki et al. |
| 5,944,940 A | 8/1999 | Toshima |
| 6,045,315 A | 4/2000 | Azumano et al. |
| 6,385,503 B1 | 5/2002 | Volle |
| 6,464,789 B1 | 10/2002 | Akimoto |
| 6,707,544 B1 * | 3/2004 | Hunter et al. ............ 356/237.5 |

* cited by examiner

Primary Examiner—Robert Raevis
(74) Attorney, Agent, or Firm—Foley & Lardner LLP

(57) ABSTRACT

The invention relates to an arrangement for transporting and inspecting semiconductor substrates (6), having at least three workstations (8, 10, 12), a changer (14), which has at least three arms (14a, 14b, 14c) which are designed to load the individual workstations (8, 10, 12) with semiconductor substrates (6). A measuring device (15) is assigned to the second workstation (10), determines the deviation of the current position of the semiconductor substrate (6) and makes it available to the arrangement (3) for the further inspection of the semiconductor substrate (6). In addition, the changer (14) is not equipped with means for exact positioning of the semiconductor substrates (6) in the workstations (8, 10, 12).

3 Claims, 8 Drawing Sheets

METHOD AND ARRANGEMENT FOR TRANSPORTING AND INSPECTING SEMICONDUCTOR SUBSTRATES

CROSS REFERENCE TO RELATED APPLICATIONS

The present application is a continuation of U.S. application Ser. No. 10/379,677, filed Mar. 6, 2003, now U.S. Pat. No. 6,789,436, which is a divisional of U.S. application Ser. No. 10/053,628, filed Jan. 24, 2002, now U.S. Pat. No. 6,553,850, the entire contents of which are incorporated herein by reference.

This invention claims priority of the German patent application 101 03 253.6 which is incorporated by reference herein.

FIELD OF THE INVENTION

The invention relates to a method for transporting and inspecting semiconductor substrates. In addition, the invention relates to an arrangement for transporting and inspecting semiconductor substrates.

BACKGROUND OF THE INVENTION

U.S. Pat. No. 5,863,170 discloses a modular process system for semiconductors. This system, for handling wafers, is of modular construction and has a large number of process stations, which are loaded with wafers. The wafers are forwarded from process station to process station by a central carousel. In the process stations, various process steps are carried out on the wafers. This arrangement can be used only for treatment in various process stations. Monitoring and inspection of the wafers is not provided.

U.S. Pat. No. 5,807,062 discloses an arrangement for handling wafer-like objects. The wafers in the arrangement are transferred from and to magazines. In the arrangement itself there are arranged three workstations. In the first workstation, the wafer-like object is aligned with respect to a plane and an angle. The next workstation represents the x/y table of an inspection microscope. The third workstation is used for the visual monitoring of the wafer-like objects by an operator. The workstations are in each case arranged at an angle of 120° to one another. A changer sits between the workstations and, with its three arms, can feed the wafer-like objects to the individual workstations. The changer has three arms and additional means for the fine positioning of the wafer-like objects.

To this end, there is on the shaft of the changer a gearwheel, in which jaws with identical toothing engage and thus permit fine adjustment of the changer. The drawback with this arrangement is that it cannot be used so universally, and fine positioning takes up a relatively long time.

SUMMARY OF THE INVENTION

It is the object of the present invention to provide a method with which wafer-like objects can be handled in a time-saving manner, and a high throughput of the wafer-like objects is achievable with this method.

The object is achieved by a method comprising the steps of:
providing at least three workstations arranged in a housing, wherein a changer being arranged in such a way that each of the workstations can be supplied with a semiconductor substrate;
lifting the changer and carrying out a rotational movement by a specific angular amount, in order to transfer al least one of the semiconductor substrates to another workstation;
lowering the changer and carrying out a rotational movement by the same angular amount in the opposite direction, without a semiconductor substrate resting on the changer; and
picking up a new semiconductor substrate from a substrate feed module.

It is a further object of the invention to provide an arrangement which permits wafer-like objects to be inspected visually and microscopically in a simple, timesaving manner. Added to this is the intention that the arrangement shall also be able to operate with inaccurately positioned wafer-like objects. Furthermore, wafer-like objects of different sizes are intended also to be processed with the invention.

The object is achieved by an arrangement for transporting and inspecting semiconductor substrates which comprises at least three workstations, a changer defining an axis of rotation, wherein the changer has at least three arms, and which is designed to load the at least three workstations with semiconductor substrates, the workstations being arranged coaxially around the axis of rotation of the changer, a measuring device is assigned to one workstation, wherein the measuring device determines the deviation of the current position of the semiconductor substrate from an intended position and makes it available to the arrangement for the further inspection of the semiconductor substrate and in that the changer is not equipped with means for moving the semiconductor substrates into the intended position.

It is advantageous to have an arrangement for transporting and inspecting semiconductor substrates. The arrangement comprises:
a first, second and third workstation,
a changer defining an axis of rotation, wherein the changer has three arms, and which is designed to load and unload the three workstations with semiconductor substrates,
the first workstation defines a transfer position, at which semiconductor substrates are introduced into the arrangement from a substrate feed module and can be transferred from the arrangement to the substrate feed module,
the second workstation is a measuring device, which determines the deviation of the current position of the semiconductor substrate from an intended position and makes it available to the arrangement for the further inspection of the semiconductor substrate, and
the third workstation defines a micro inspection and comprises an x/y table, which feeds the semiconductor substrate to a microscope.

BRIEF DESCRIPTION OF THE DRAWINGS

The subject of the invention is illustrated schematically in the drawing and will be described below using the figures, in which:

FIG. 5: shows an illustration of two cycles in a possible scenario of the flow of the semiconductor substrates in the arrangement, macro inspection by the user being dispensed with;

DETAILED DESCRIPTION OF THE INVENTION

Figure 1:
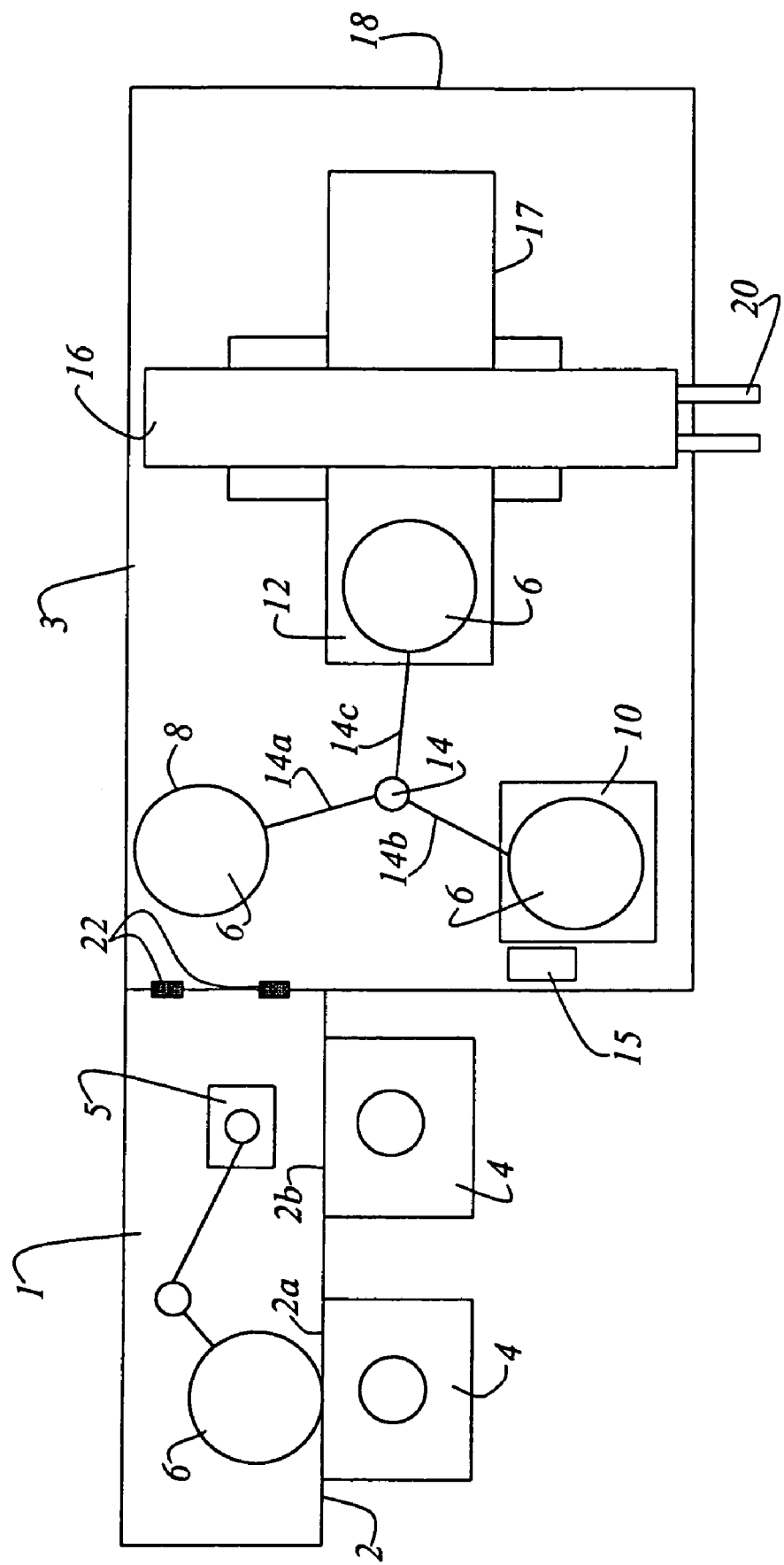
FIG. 1: shows a schematic view of the arrangement, which is connected to a substrate feed module for wafer-like objects.

FIG. 1 shows, in schematic form, a lateral assignment of a substrate feed module 1 to an arrangement 3 having a plurality of workstations 8, 10, 12. The substrate feed module 1 in this exemplary embodiment is oriented with respect to the arrangement 3 in such a way that it can be loaded with substrates from its front side 2 via one or more load ports 2a, 2b. Normally, two load ports 2a, 2b are provided. In this case, open or closed cassettes 4 are used, which are inserted manually, by the user, or by means of automation, for example by means of a robot, into the load ports 2a, 2b. The cassettes 4 can be filled with semiconductor substrates 6 or can also be empty, depending on the working sequence envisaged. For example, all the cassettes 4 can be filled and semiconductor substrates 6 are first removed from one cassette 4, inserted into the arrangement 3 and, after treatment and monitoring there, are put back into the same cassette 4 again. This procedure is then repeated for the next cassette 4, while the user retrieves the cassette 4 with the processed semiconductor substrates 6 and, in its place, inserts a new cassette 4 with semiconductor substrates 6 into the free load port 2a, 2b. Provided in the interior of the substrate feed module 1 is a transport robot 5, which transfers the semiconductor substrates 6 into the arrangement 3. The arrangement of the substrate feed module 1 in FIG. 1 is merely one of a plurality of possible configurations. Likewise, the substrate feed module 1 can be rotated through 90°, so that the cassettes point away from the arrangement 3.

As already mentioned, a plurality of workstations 8, 10 and 12 are provided in the arrangement 3. At the workstations 8, 10 and 12, appropriate investigations, monitoring and inspections are carried out on the semiconductor substrates 6. In the present exemplary embodiment, three workstations, a first, a second and a third workstation 8, 10 and 12, are provided in the arrangement.

Arranged centrally between the workstations 8, 10 and 12 is a changer 14 for the semiconductor substrates 6. The changer 14 has three arms 14a, 14b and 14c, with which the individual workstations 8, 10 and 12 can be supplied simultaneously with the semiconductor substrates 6. The first workstation 8 is used for acceptance from and transfer to the substrate feed module 1. The second workstation 10 is used for the alignment, for the determination of the positioning and for the visual inspection of the semiconductor substrates 6. In order to align the semiconductor substrates 6, the second workstation 10 is assigned a measuring device 15, which detects marks applied to the semiconductor substrate 6 and determines codings on the semiconductor substrates 6. Furthermore, the measuring device 15 determines the deviation from the accurately-positioned deposition of the semiconductor substrate 6 in the second workstation 10. The data determined in this way are forwarded to a central processing unit (not shown). The third workstation 12 is designed for the micro inspection of the semiconductor substrates 6. The third workstation 12 has an x/y table 17, which feeds the semiconductor substrate 6 to a microscope 16 for the micro inspection. A z displacement can also be made possible by the x/y table. The arrangement 3 is surrounded by a housing 18, which shuts off the three workstations 8, 10 and 12 and the microscope 16 with respect to the ambient air and provides the correspondingly required clean-room conditions. Added to this is the fact that the possibility of intervention by the user in the arrangement 3 is likewise prevented by the housing 18, which additionally constitutes a security aspect. In the embodiment disclosed here, the microscope 16 is provided with an eyepiece 20, which provides the user with the possibility of carrying out a visual micro inspection of the semiconductor substrates 6 to be examined. Of course, the semiconductor substrates 6 can be inspected automatically by the microscope 16 in the third workstation 12. The housing 18 of the arrangement 3 and the substrate feed module 1 have docking elements 22, which permit a variable association between substrate feed module 1 and arrangement 3.

Figure 2:
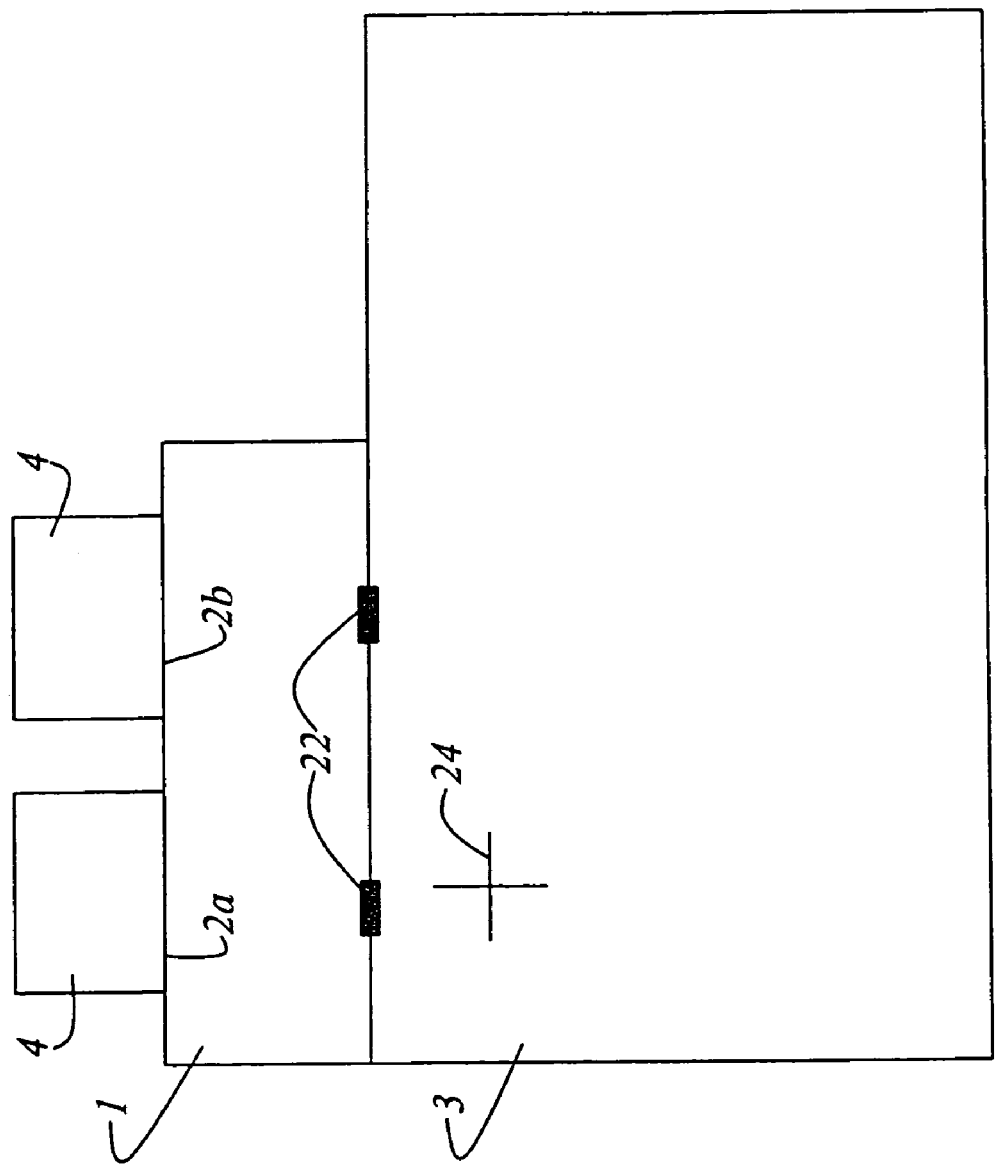
FIG. 2: shows a further exemplary embodiment of a possible set-up of the arrangement and of the substrate feed module.

An exemplary embodiment of the this variable association is shown in FIG. 2 and shows a possible setup of the arrangement 3 and the substrate feed module 1. The arrangement 3 defines a transfer position 24, at which the semiconductor substrates 6 are introduced into the arrangement 3 by the substrate feed module 1. For this purpose, the docking elements 22 are fitted in or on the housing 18 of the arrangement 3 in an appropriate way. From the cassettes 4, the semiconductor substrates 6 pass via the load ports 2a, 2b into the substrate feed module 1 and, from there by means of the transport robot 5, to the transfer position 24 of the arrangement 3.

Figure 3:
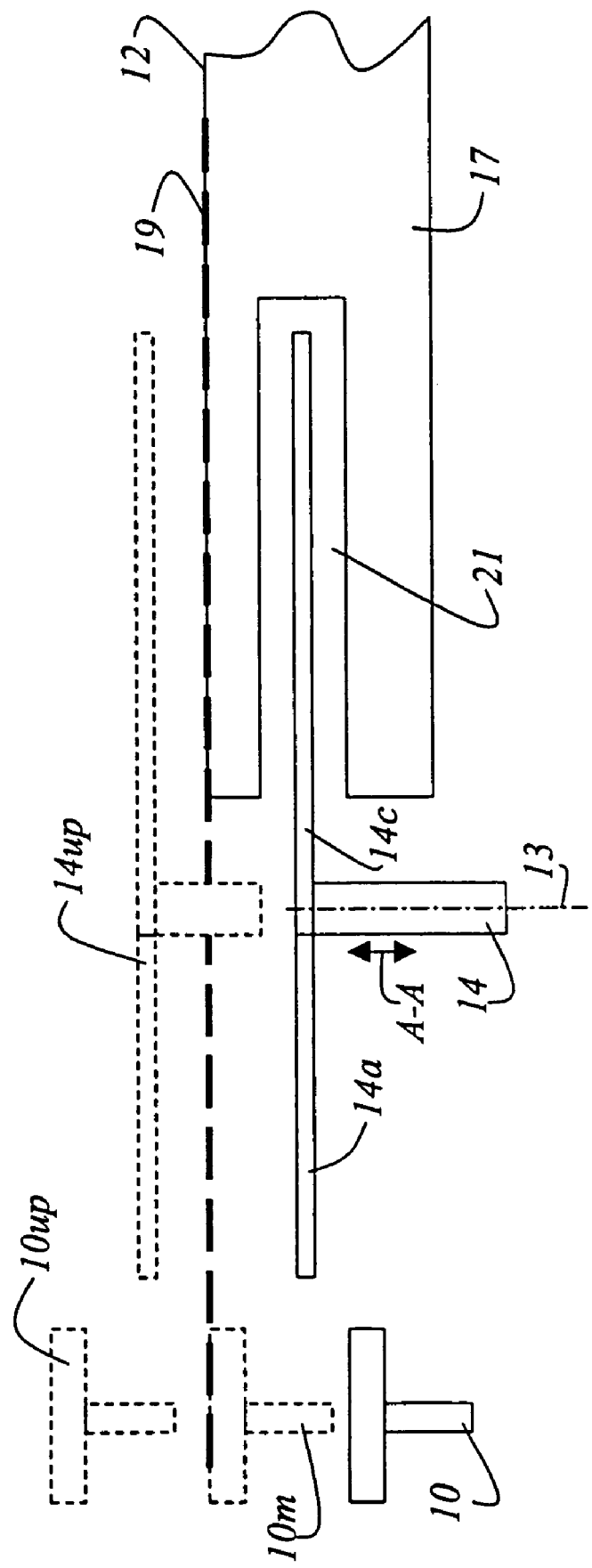
FIG. 3: shows a schematic illustration of the configuration of the workstation in side view in the area of the optical inspection microscope.

FIG. 3 shows a schematic illustration of the configuration of the workstation in side view in the area of the optical inspection microscope 16. The changer 14 can be rotated freely about an axis of rotation 13. In addition, the changer 14 can be moved up and down axially, in order in this way to pick up the semiconductor substrates 6 or set them down in the third workstation 12. The axial movement of the changer 14, which likewise corresponds to the movement in the z direction, is represented by a double arrow A-A. In the lifted position 14up, the changer 14 is shown dashed. In the lifted position 14up of the changer 14, the changer is able to move with its arms above a plane 19 which is defined by a wafer set down in the workstation 12. The plane 19 is illustrated in FIG. 3 by a thick dashed line. In addition, the workstation 12 has a cutout 21, through which the changer 14 can freely rotate its arms 14a and 14b. The cutout 21 makes it possible for the changer 14 to rotate freely in the forward and reverse directions when in the lowered position. The second workstation 10, in the basic position in FIG. 3, is likewise represented by continuous lines. The second workstation 10 can be moved into a central position 10m and into a lifted position 10up. In the central position 10m, the second workstation 10 is at the level of the plane 19. As already mentioned in FIG. 1, the second and third workstations 10 and 12 are arranged physically in such a way that they can be supplied with semiconductor substrates 6 by the arms 14a and 14b of the changer 14.

Figure 4:
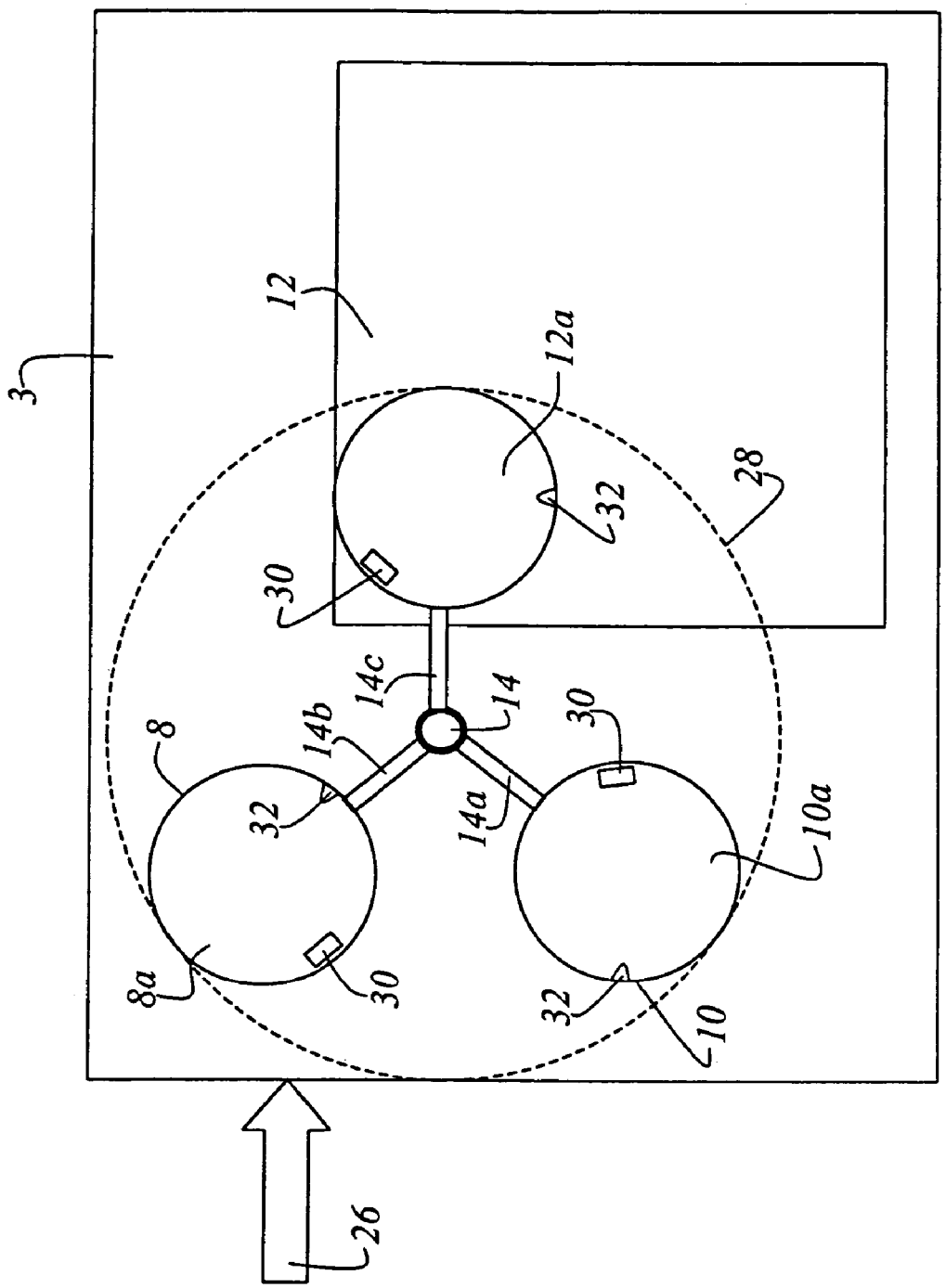
FIG. 4: shows a plan view of the arrangement to clarify the flow of the semiconductor substrates.

FIG. 4 shows a schematic plan view of the arrangement 3 to clarify the flow of the semiconductor substrates 6. An arrow 26 in FIG. 4 marks the point at which the semiconductor substrates 6 are introduced into the arrangement 3. In a preferred embodiment, the changer 14 has three arms 14a, 14b and 14c, which are each arranged at an angle of 120°. The changer 14 guides the semiconductor substrates 6 to the individual workstations 8, 10 and 12. The first workstation 8 is the transfer position 8a, the second workstation 10 is the macro inspection 10a, and the third workstation 12 is the micro inspection 12a. The transfer position 8a, macro inspection 10a and micro inspection 12a define the position of the changer 14 at which the semiconductor substrates 6 are accepted by the workstations 8, 10 and 12 or are transferred to the workstations 8, 10 and 12. Given optimum utilization, there are three semiconductor substrates in the arrangement 3 at the same time, simultaneous macro inspection 10a and micro inspection 12a being possible. The dashed circle in FIG. 4 defines an outer movement circle 28 of the changer 14 together with the semiconductor substrates 6 resting on the changer 14. Each of the semiconductor substrates 6 has an identification 30 and a notch 32. The identification 30 comprises, for example, a barcode, a numeric identification, an alphanumeric identification or combinations thereof. The notch 32 is used to determine the orientation of the semiconductor substrate 6 and, consequently, also for its precise spatial alignment.

Figure 5:
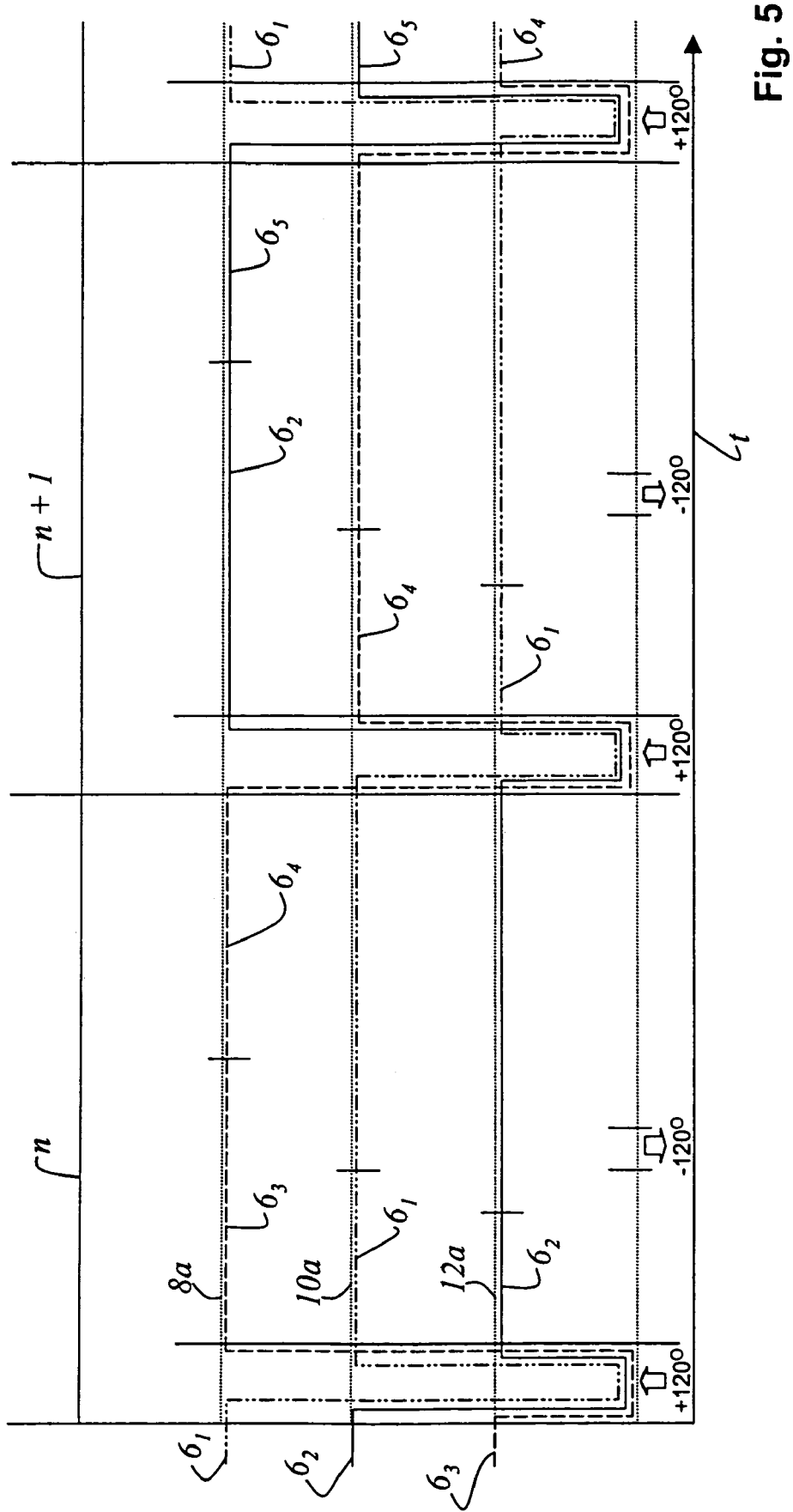

FIG. 5 shows a graphical representation of two cycles n and n+1 in a possible scenario of the flow of the semiconductor substrates 6 in the arrangement 3. The time t is plotted on the x-axis in FIG. 5 and in FIGS. 6 to 8. The representations in FIGS. 5 to 8 are to be viewed as schematic, and the time intervals represent an approximate duration of the processing time of the semiconductor substrates at the workstations. In the exemplary embodiment illustrated in FIG. 5, three semiconductor substrates 6 are located simultaneously in the arrangement 3. A visual macro inspection is not carried out by the operator in this exemplary embodiment. At the beginning of the flow of the semiconductor substrates 6 in the arrangement, the first semiconductor substrate $6_1$ is at the transfer position 8a, the second semiconductor substrate $6_2$ is in the macro inspection 10a, and the third semiconductor substrate $6_3$ is in the micro inspection 12a. The transfer position 8a, the macro inspection 10a and the micro inspection 12a are illustrated as a dashed line in FIGS. 5 to 8. The residence time of the semiconductor substrates is identified by vertical lines in FIGS. 5 to 8, and the interspace is designated by the reference symbol of the semiconductor substrate just being processed.

The changer 14 makes a stroke in the axial direction (in each case represented by an upward arrow in FIGS. 5 to 8) and lifts the second and the third semiconductor substrates $6_2$ and $6_3$ off the macro inspection 10a and the micro inspection 12a, respectively. The changer 14 rotates, and in this way the first semiconductor substrate $6_1$ reaches the macro inspection 10a, the second semiconductor substrate $6_2$ reaches the micro inspection 12a and the third semiconductor substrate $6_3$ is finally transported to the transfer position 8a and transferred to the substrate feed module 1. The changer 14 is then lowered (in each case represented by a downward arrow in FIGS. 5 to 8) and rotated back through −120° with empty arms. A fourth semiconductor substrate $6_4$ is fed to the empty arm at the transfer position 8a from the substrate feed module 1. Before this exchange is carried out, the necessary inspection has been carried out on the first and second semiconductor substrates $6_1$ and $6_2$ at the second and third workstations 10 and 12. After a certain time, the changer 14 again carries out an axial stroke, in order to initiate the cycle n+1. The changer 14 once again makes an axial stroke and carries out a rotation by +120°. The fourth semiconductor substrate $6_4$ therefore reaches the macro inspection 10a, and the first semiconductor substrate $6_1$ is fed to the micro inspection 12a. The movement sequence of the changer 14 is identical to that already mentioned above. At the transfer position 8a, the second semiconductor substrate $6_2$ is replaced by a fifth semiconductor substrate $6_5$. This fifth semiconductor substrate $6_5$ then passes through the workstations 8, 10 and 12 in the arrangement 3 in the following cycle.

Figure 6:
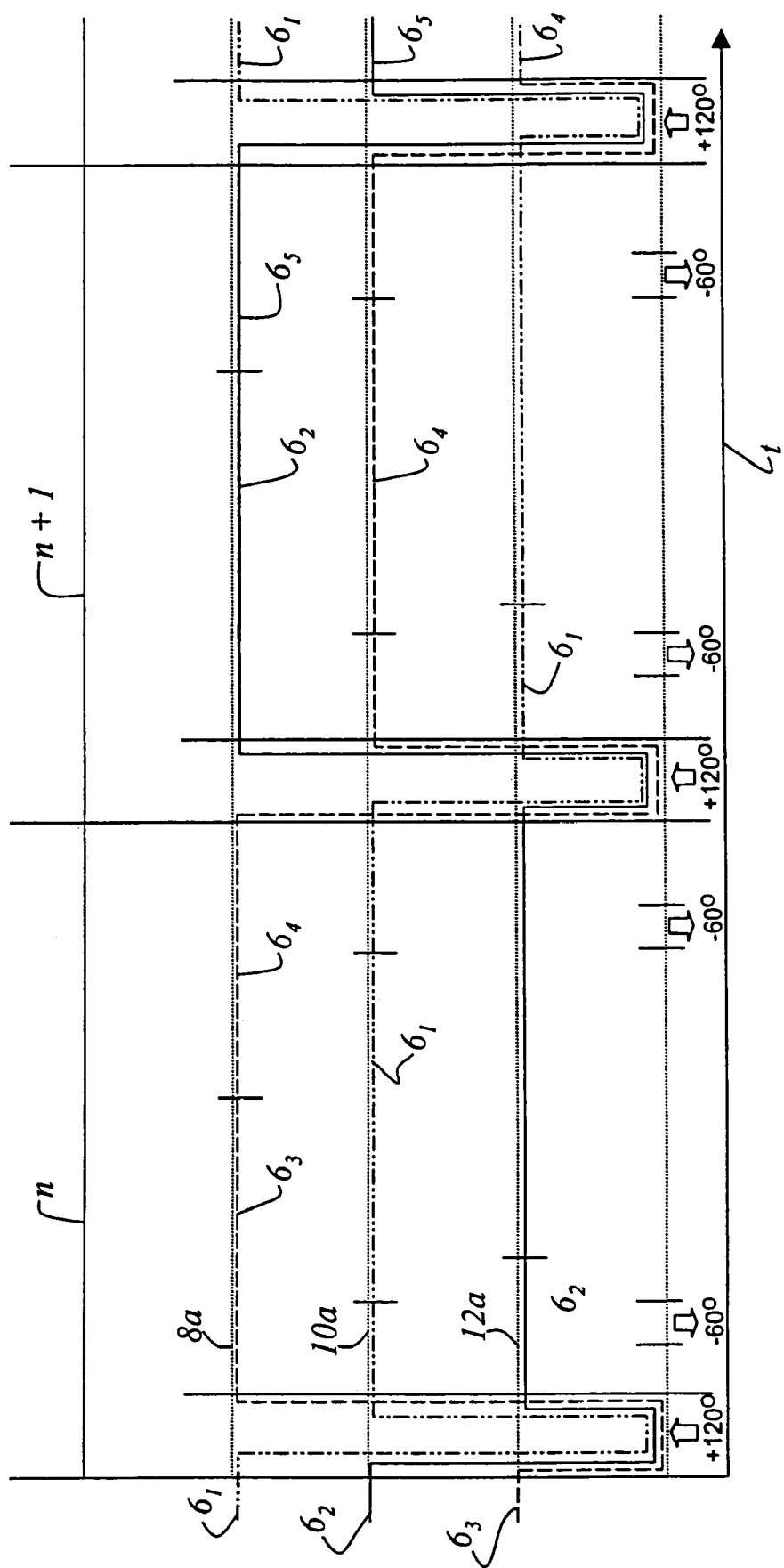
FIG. 6: shows an illustration of two cycles in a further scenario of the flow of the semiconductor substrates in the arrangement, a macro inspection additionally being carried out.

A further embodiment of the handling of the semiconductor substrates 6 in the arrangement 3 is disclosed in FIG. 6. In this case, a macro inspection is additionally carried out by the user. Just as at the start of the flow of semiconductor substrates 6 disclosed in FIG. 5 in the arrangement 3, the first semiconductor substrate $6_1$ is at the transfer position 8a, the second semiconductor substrate $6_2$ is in the macro inspection 10a and the third semiconductor substrate $6_3$ is in the micro inspection 12a. The changer 14 makes an axial stroke and lifts the second and the third semiconductor substrates $6_2$ and $6_3$ off the macro inspection 10a and the micro inspection 12a, respectively. The changer 14 rotates through +120° and, in this way, the first semiconductor substrate $6_1$ reaches the macro inspection 10a, the second semiconductor substrate $6_2$ reaches the micro inspection 12a and the third semiconductor substrate $6_3$ is finally transported to the transfer position 8a and transferred to the substrate feed module 1. While the micro inspection 12a is being carried out at the third workstation 12, the changer 14 is lowered axially and is then rotated through −60°. The changer 14 is thus moved out of the working range of the second workstation 10. This is necessary, since the semiconductor substrate 6 in the second workstation 10 is pivoted in the visual range of the operator and rotated, in order to detect possible macroscopic faults on the semiconductor substrate 6. When the visual macro inspection has been completed, the changer 14, which is still lowered, rotates through a further −60°. A fourth semiconductor substrate $6_4$ is fed to the arm at the transfer position 8a from the substrate feed module 1. Before this exchange was carried out, the necessary inspection has been carried out on the first and second semiconductor substrates $6_1$ and $6_2$ at the second and third workstations 10 and 12. After a certain time, the changer 14 again carries out an axial stroke, in order to initiate the cycle n+1. The changer 14 once more makes an axial stroke and a rotation through +120°. The fourth semiconductor substrate $6_4$ thus reaches the macro inspection, and the first semiconductor substrate $6_1$ is fed to the micro inspection 12a. The movement sequence of the changer 14 is identical to that already mentioned above. At the transfer position 8a, the second semiconductor substrate $6_2$ is replaced by a fifth semiconductor substrate $6_5$. This fifth semiconductor $6_5$ then passes through the workstations 8, 10 and 12 in the arrangement 3 in the following cycle.

Figure 7:
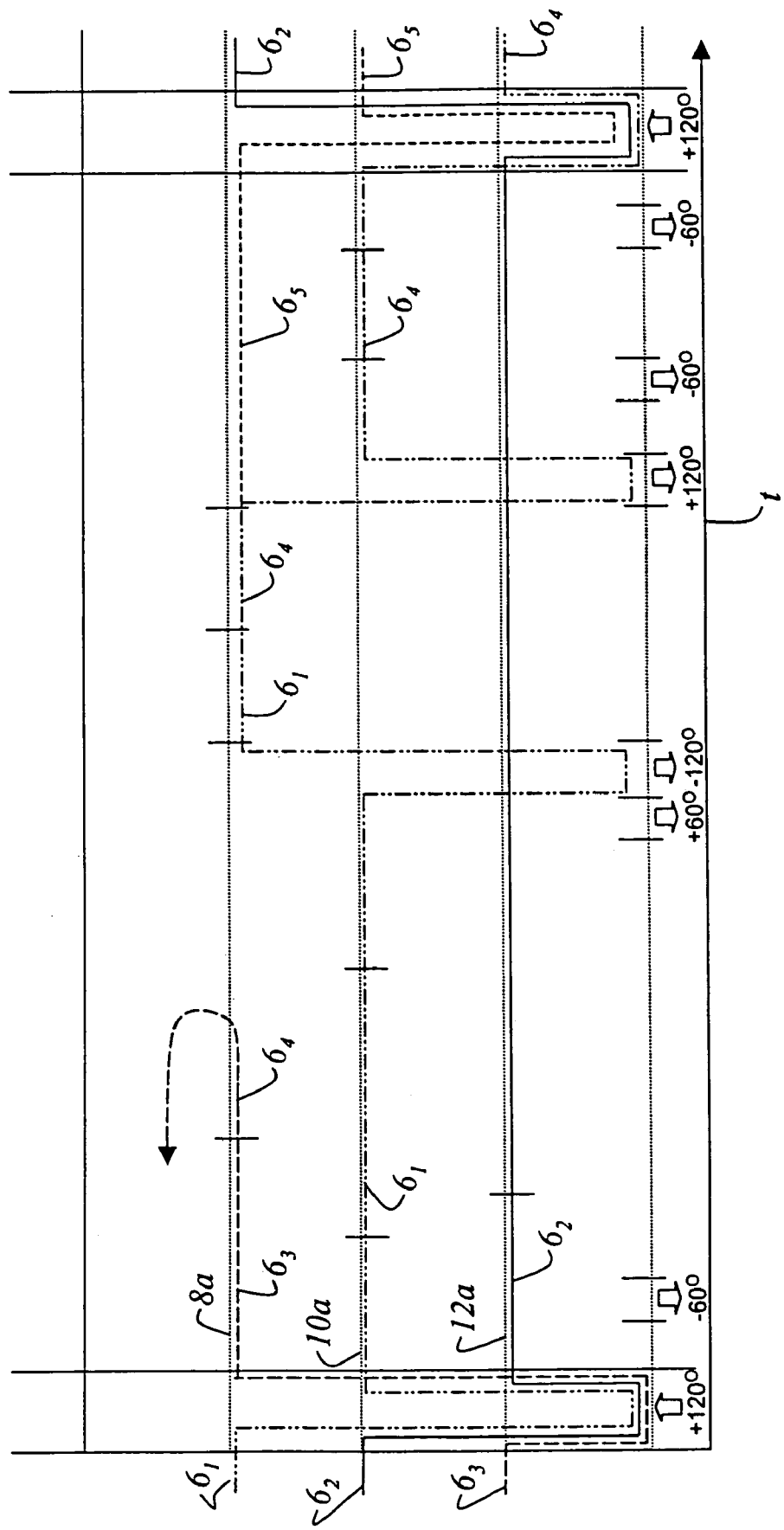
FIG. 7: shows an illustration of a cycle in which a poor semiconductor substrate has been found during the visual macro inspection.

FIG. 7 shows a representation of a cycle in which a poor semiconductor substrate has been found during the visual macro inspection. Here, just as already shown in FIG. 6, a visual macro inspection is carried out by the user. Just as at the start of the flow of semiconductor substrates 6 disclosed in FIG. 5 in the arrangement 3, the first semiconductor substrate $6_1$ is at the transfer position 8a, the second semiconductor substrate $6_2$ is in the macro inspection 10a and the third semiconductor substrate $6_3$ is in the micro inspection 12a. The changer 14 makes an axial stroke and lifts the second and the third semiconductor substrates $6_2$ and $6_3$ off the macro inspection 10a and the micro inspection 12a. The changer 14 rotates through +120° and, in this way, the first semiconductor substrate $6_1$ reaches the macro inspection 10a, the second semiconductor substrate $6_2$ reaches the micro inspection 12a, and the third semiconductor substrate $6_3$ is finally transported to the transfer position 8a and transferred to the substrate feed module 1, the changer 14 being lowered axially. While the micro inspection 12a is being carried out at the third workstation 12, changer 14 is then rotated through −60°. Thus, as already mentioned in FIG. 6, the changer 14 is moved out of the working range of the second workstation 10. During the visual macro inspection, the first semiconductor substrate $6_1$ has been identified as faulty. A fourth semiconductor substrate $6_4$ which may possibly already have been transferred to the changer 14 at the transfer position 8a, is transported back into the substrate feed module 1 again. The changer 14, lowered axially, rotates through a further +60°. One arm of the changer 14 accepts the first semiconductor substrate $6_1$ by lowering the second workstation 10 into the basic position. It is necessary to lower the workstation 10 into the basic position in order that the changer 14 can rotate freely. The changer 14 rotates through −120° in the lowered state and thus brings the first semiconductor substrate $6_1$ into the transfer position 8a. The second semiconductor substrate $6_2$ is still in the third workstation 12 or the micro inspection 12a. At the transfer position 8a, the first faulty semiconductor substrate $6_1$ is transferred to the substrate feed module 1, and a fourth semiconductor substrate $6_4$ from the substrate feed module 1 is deposited on the changer 14. Finally, the changer, lowered, rotates through +120° and brings the fourth semiconductor substrate $6_4$ to the second workstation 10. The fifth semiconductor substrate $6_5$ is transferred to the changer 14 at the transfer position 8a. The changer 14, lowered, then rotates through −60°, in order to leave the active range of the second workstation 10 free. At the first workstation 10, the visual macro inspection is carried out on the fourth semiconductor substrate $6_4$. After the visual macro inspection has been completed, the changer 14 again rotates through −60° and then the semiconductor substrates located in the arrangement 3 can be changed in accordance with the method already described in FIG. 5 and FIG. 6.

Figure 8:
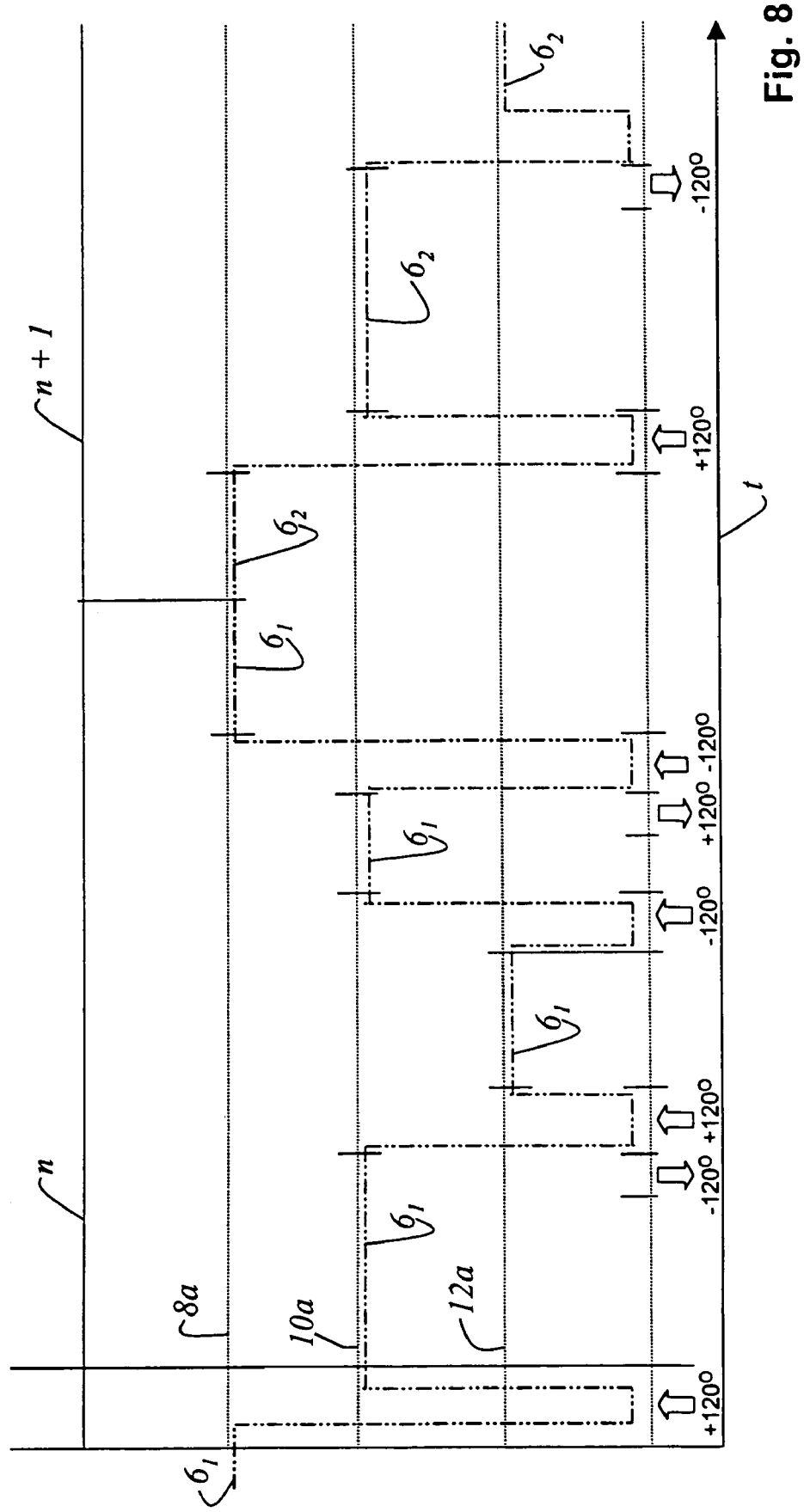
FIG. 8: shows an illustration of the handling of semiconductor substrates, in which only one semiconductor substrate per cycle is inspected in the arrangement, and no visual macro inspection is carried out.

FIG. 8 shows an embodiment of the method for handling semiconductor substrates in which only one semiconductor substrate 6 per cycle is examined in the arrangement 3. No visual macro inspection takes place. The first semiconductor substrate $6_1$ is transferred from the substrate feed module 1 to the changer 14. The changer rotates through +120° and the first semiconductor substrate $6_1$ is transferred to the second workstation 10. There, the alignment of the first semiconductor substrate $6_1$ is determined and the identification 30 on the first semiconductor substrate $6_1$ is then read. In the meantime, the changer 14, lowered axially, rotates through −120°. The changer then makes a z stroke and removes the first semiconductor substrate $6_1$ from the second workstation 10. The changer rotates through +120° and transfers the first semiconductor substrate $6_1$ to the third workstation 12, where the micro inspection is carried out. After the micro inspection, the changer 14 makes an other z stroke, removes the first semiconductor substrate $6_1$ from the third workstation 12 and rotates through −120°. The first semiconductor substrate $6_1$ in turn passes to the second workstation 10 and, there, the notch 32 is determined, so that the first semiconductor substrate $6_1$ is aligned. In the meantime, the changer 14, lowered axially, rotates through +120°. The changer 14 then makes an axial stroke, removes the first semiconductor substrate $6_1$ from the second workstation 10 and rotates through −120°. The first semiconductor substrate $6_1$ is then at the transfer position 8a and is transferred to the substrate feed module 1. A second semiconductor substrate $6_2$ is removed from the substrate feed module 1 and, using the second semiconductor substrate $6_2$, the method already described above is carried out as for the first semiconductor substrate $6_1$.

It is self-evident that, depending on the number of semiconductor substrates 6 in the arrangement 3, or changes in the flow of the semiconductor substrates 6 through the arrangement 3, such as the removal of defective semiconductor substrates 6, the residence time of the semiconductor substrates at the individual workstations 6 may change. Consequently, this also has an effect on the cycle time.

The invention has been described with reference to a special embodiment. However, it is self-evident that changes and modifications can be carried out without leaving the scope of protection of the following claims in so doing.

What is claimed is:

1. Method for transporting and inspecting semiconductor substrates, comprising the steps of:
   providing at least three workstations and a changer arranged in a housing, the workstations and the changer all being open to each other in such a way that each of the workstations can be supplied with a semiconductor substrate;
   lifting the changer and carrying out a rotational movement by a specific angular amount, in order to transfer at least one of the semiconductor substrates to another workstation;
   lowering the changer and carrying out a rotational movement by the same angular amount in the opposite direction, without a semiconductor substrate resting on the changer; and
   picking up a new semiconductor substrate from a substrate feed module.

2. Method according to claim 1, wherein the first workstation defines a transfer position, at which the semiconductor substrates are transferred from a substrate feed module into the housing or are transported back from the housing into the substrate feed module.

3. An arrangement for transporting and inspecting semiconductor substrates, comprising:
   at least three workstations arranged in a housing; and
   a changer arranged in the same housing and at least three workstations being open to each other such that each of said workstations can be supplied with a semiconductor substrate;
   said changer being rotatable by a specific angular amount in order to transfer at least one of the semiconductor substrates from one of said workstations to another of said workstations;
   said changer being further rotatable by said specific angular amount in an opposite direction without transporting a semiconductor substrate in order to pick up a new semiconductor substrate from a substrate feed module.

* * * * *